(12) United States Patent
Mizutani et al.

(10) Patent No.: US 8,527,243 B2
(45) Date of Patent: Sep. 3, 2013

(54) AIR FLOW MEASUREMENT APPARATUS

(75) Inventors: Akitoshi Mizutani, Okazaki (JP); Takao Ban, Toyohashi (JP)

(73) Assignee: Denso Corporation, Kariya (JP)

( * ) Notice: Subject to any disclaimer, the term of this patent is extended or adjusted under 35 U.S.C. 154(b) by 349 days.

(21) Appl. No.: 13/100,426

(22) Filed: May 4, 2011

(65) Prior Publication Data
US 2011/0271768 A1 Nov. 10, 2011

(30) Foreign Application Priority Data
May 7, 2010 (JP) .................. 2010-107330

(51) Int. Cl.
*G01F 1/00* (2006.01)
*G01F 7/00* (2006.01)

(52) U.S. Cl.
USPC ............................... 702/189; 702/45; 702/46

(58) Field of Classification Search
USPC ............................................. 702/45, 46, 189
See application file for complete search history.

(56) References Cited

U.S. PATENT DOCUMENTS
2004/0177102 A1 9/2004 Nakamura et al.
2009/0299657 A1 12/2009 Mizutani et al.

FOREIGN PATENT DOCUMENTS
| JP | 59-144431 | 9/1984 |
| JP | P2006-165737 A | 6/2006 |
| JP | P4074823 | 2/2008 |
| JP | P2009-097925 A | 5/2009 |
| JP | P2009-288153 A | 12/2009 |

*Primary Examiner* — Janet Suglo
(74) *Attorney, Agent, or Firm* — Nixon & Vanderhye PC

(57) ABSTRACT

An air flow measurement apparatus includes an air flow sensor for outputting an air flow signal indicative of detected air flow, a reference voltage generator for outputting reference voltage signals, a multiplexer for sequentially selecting the signals in a predetermined order, an A/D converter for converting the signals into digital data in an order selected by the multiplexer, and a signal processing unit for applying correction processing to air flow voltage data corresponding to the air flow signal using reference voltage data corresponding to the reference voltage signals. The signal processing unit has a sampling timing setting section for determining sampling timings at which the A/D converter samples the signals in such a manner that the sampling timing at which the air flow signal is sampled is interposed between the sampling timings at which successive two of the reference voltage signals are sampled.

14 Claims, 9 Drawing Sheets

FIG. 8A

| INPUT VOLTAGE (V) \ INTAKE AIR TEMP (°C) | -40 | 20 | Ta | 80 | 130 |
|---|---|---|---|---|---|
| VD1 | | | | | |
| VD2 | | | | | |
| VD | | | → Gi | | |
| VD3 | | | | | |
| VD4 | | | | | |

FIG. 8B

| FLOW RATE (g/s) \ INTAKE AIR TEMP (°C) | -40 | 20 | Ta | 80 | 130 |
|---|---|---|---|---|---|
| G1 | | | | | |
| G2 | | | | | |
| Gi | | | → Ki | | |
| G3 | | | | | |
| G4 | | | | | |

US 8,527,243 B2

AIR FLOW MEASUREMENT APPARATUS

CROSS REFERENCE TO RELATED APPLICATION

This application is based on and claims priority to Japanese Patent Application No. 2010-107330 filed on May 7, 2010, the contents of which are incorporated herein by reference.

FIELD OF THE INVENTION

The present invention relates to an air flow measurement apparatus having an A/D converter for converting an output signal of a flow sensor into digital data, in particular, for use in an internal combustion engine.

BACKGROUND OF THE INVENTION

US 2004/0177102 corresponding to JP 4074823 discloses a signal processing unit including a time analog-to-digital converter (hereinafter called the "TAD") and a correction circuit. In the signal processing circuit, multiple analog voltage signals are selectively inputted by an analog multiplexer to the TAD. The TAD sequentially converts the inputted analog voltage signals to digital outputs. The TAD has nonlinear input and output characteristics that can cause a conversion error. The correction circuit applies a linear correction to the output of the TAD by using at least three reference voltages. Specifically, the correction circuit uses the minimum voltage Vmin, the maximum voltage Vmax, and the center voltage Vc.

By the way, a thermal air flow meter (i.e., hot-wire flow meter) has been widely used to measure intake air flow to an engine of a vehicle. In a conventional thermal air flow meter, heat of a heat generating element is dissipated by the air flow, and the air flow is measured by using the principle that there is a correlation between the amount of dissipated heat and the amount of the air flow. However, since the amount of the air flow is measured as an absolute value, the direction of the air flow cannot be detected. For example, in a four-cylinder engine, intake air pulsation increases at low speed and high load operations, and a reversal of the direction of air flow may occur. In the conventional flow meter, since the air flow is measured without consideration of the direction of the air flow, the amount of intake air flow to a firing chamber of the engine cannot be accurately measured.

US 2009/0299657 corresponding to JP-A-2009-288153 discloses a system including a thermal air flow meter for measuring air flow by detecting the direction of the air flow. The system includes a TAD and a signal processing unit. The TAD converts an output of the flow meter into a digital signal. The signal processing unit applies correction processing to the digital signal and outputs the corrected digital signal to external device such as an electronic control unit (ECU).

The flow meter includes a heat generating element and a temperature detection element. The heat generating element is located in the center of a thin-film portion of a silicon substrate. The temperature detection element is located on upstream and downstream sides of the heat generating element with respect to the flow of intake air. A temperature control circuit controls the temperature of the heat generating element so that the temperature of the heat generating element can be greater than an intake air temperature by a predetermined value. The air flow is measured by calculating a difference between a temperature detected by the temperature detection element located on the upstream side and a temperature detected by the temperature detection element located on the downstream side. The calculated difference changes sign, when the direction of the air flow is reversed. Therefore, the direction of the air flow can be detected based on the sign of the calculated difference. It is noted that the air flow is measured as mass flow rate [g/sec].

Specifically, the heat generating element of the flow meter is a temperature-sensitive resistor having a temperature dependence and incorporated in a bridge circuit. The heating current flowing through the heat generating element is controlled by the temperature control circuit so that the temperature of the heat generating element can be kept greater than the ambient temperature (i.e., intake air temperature) by a predetermined value.

However, output characteristics and temperature characteristics vary from flow meter to flow meter. The signal processing unit corrects the individual variation of the flow meter so that the corrected signal can be outputted to the ECU.

The present inventors considered that the signal processing unit disclosed in US 2004/0177102 is applied to the system disclosed in US 2009/0299657 to digitally correct the individual variation. However, the present inventors found the following disadvantages.

In the signal processing unit disclosed in JP-4074823, five analog voltage signals are selectively inputted to the TAD, and the TAD sequentially converts the analog voltage signals into digital data (hereinafter called the "TAD output data"). The TAD output data is inputted to the correction circuit, and the correction circuit applies correction processing, such as linear correction and temperature dependence correction, to the TAD output data. The corrected TAD output data is converted into a frequency signal and inputted to the ECU.

The five analog voltage signals includes three reference voltage signals Vref1, Vref2, and Vref3, an intake air temperature voltage signal Vt, and an air flow voltage signal Vq. The intake air temperature voltage signal Vt is an output signal of an intake air temperature sensor, and the air flow voltage signal Vq is an output signal of the flow meter.

FIG. 10 is a flowchart of a program, created by the inventors, for applying the signal processing unit disclosed in US 2004/0177102 to the system disclosed in US 2009/0299657. The program is summarized below.

When the TAD starts an A/D conversion process, switches of an analog multiplexer are controlled so that the analog multiplexer can switch to the third reference voltage signal Vref3. Thus, the third reference voltage signal Vref3 is inputted to and sampled by the TAD. Then, the third reference voltage signal Vref3 is converted into digital data, and the digital data corresponding to the third reference voltage signal Vref3 is stored in a register at step S81.

Then, the second reference voltage signal Vref2, the first reference voltage signal Vref1, the intake air temperature voltage signal Vt, and the air flow voltage signal Vq are processed in the same manner as the third reference voltage signal Vref3 at steps S82, S83, S84, and S85, respectively.

Thus, the five analog voltage signals are inputted to the TAD with a constant period of T1. In other words, five steps S81-S85 are repeated with the constant period of T1. The period of T1 is a time between the same steps.

Further, steps S91-S93 are performed in parallel with steps S81-S85.

At step S91, correction processing including linear correction disclosed in US 2004/0177102 and temperature dependence correction disclosed in US 2009/0299657 is applied to the TAD output data.

At step S92, the corrected TAD output data is converted into the frequency signal.

At step S93, the frequency signal is outputted to the ECU.

According to the program shown in FIG. 10, the five analog voltage signals are sequentially sampled and converted with the constant period of T1. That is, each of the five analog signals including the air flow voltage signal Vq is sampled and converted with the constant period of T1.

Accordingly, the air flow voltage signal Vq as an output signal of the flow meter is sampled and converted with the constant period of T1. Therefore, as shown in FIG. 9B, it may be difficult to follow the change in the air flow under high frequency pulsation caused when an engine rotates at high speed.

SUMMARY OF THE INVENTION

In view of the above, it is an object of the present invention to provide an air flow measurement apparatus for reducing a sampling period with which an air flow voltage signal as an output signal of a flow meter is sampled.

According to an aspect of the present invention, an air flow measurement apparatus includes an air flow detector, a reference voltage generator, an analog multiplexer, an A/D converter, and a signal processing unit. The air flow detector has an air flow sensor for detecting air flow through a passage. The air flow detector converts an output signal of the air flow sensor into an air flow voltage signal. The reference voltage generator outputs multiple reference voltage signals. The analog multiplexer sequentially selects the air flow voltage signal and the reference voltage signals in a predetermined order. The A/D converter sequentially samples and converts the air flow voltage signal and the reference voltage signals into digital data in an order selected by the analog multiplexer. The digital data corresponding to the air flow voltage signal is defined as air flow voltage data, and the digital data corresponding to the reference voltage signals are defined reference voltage data. The signal processing unit applies correction processing to the air flow voltage data using the reference voltage data. The signal processing unit includes a sampling timing setting section for determining sampling timings at which the A/D converter samples the air flow voltage signal and the reference voltage signals. The sampling timing setting section determines the sampling timings in such a manner that the sampling timing at which the air flow voltage signal is sampled is interposed between the sampling timings at which each successive two of the reference voltage signals are sampled.

According to another aspect of the present invention, an air flow measurement apparatus includes an air flow detector, a temperature detector, a reference voltage generator, an analog multiplexer, an A/D converter, and a signal processing unit. The air flow detector has an air flow sensor for detecting air flow through a passage. The air flow detector converts an output signal of the air flow sensor into an air flow voltage signal. The temperature detector has a temperature sensor for detecting a temperature of the air flow through the passage. The temperature detector converts an output signal of the temperature sensor into a temperature voltage signal. The reference voltage generator outputs multiple reference voltage signals. The analog multiplexer sequentially selects the air flow voltage signal, the temperature voltage signal, and the reference voltage signals in a predetermined order. The A/D converter sequentially samples and converts the air flow voltage signal, the temperature voltage signal, and the reference voltage signals into digital data in an order selected by the analog multiplexer. The digital data corresponding to the air flow voltage signal is defined as air flow voltage data, the digital data corresponding to the temperature voltage signal is defined as temperature voltage data, and the digital data corresponding to the reference voltage signals are defined reference voltage data. The signal processing unit applies correction processing to the air flow voltage data using the temperature voltage data and the reference voltage data. The signal processing unit includes a sampling timing setting section for determining sampling timings at which the A/D converter samples the air flow voltage signal, the temperature voltage signal, and the reference voltage signals. The sampling timing setting section determines the sampling timings in such a manner that the sampling timing at which the air flow voltage signal is sampled is interposed between the sampling timings at which each successive two of the temperature voltage signal and the reference voltage signals are sampled.

BRIEF DESCRIPTION OF THE DRAWINGS

The above and other objectives, features and advantages of the present invention will become more apparent from the following detailed description made with check to the accompanying drawings. In the drawings:

FIG. 8A is a diagram illustrating a first table for calculating air flow rate, and FIG. 8B is a diagram illustrating a second table for calculating a correction factor;

DETAILED DESCRIPTION OF THE PREFERRED EMBODIMENTS

Figure 1:
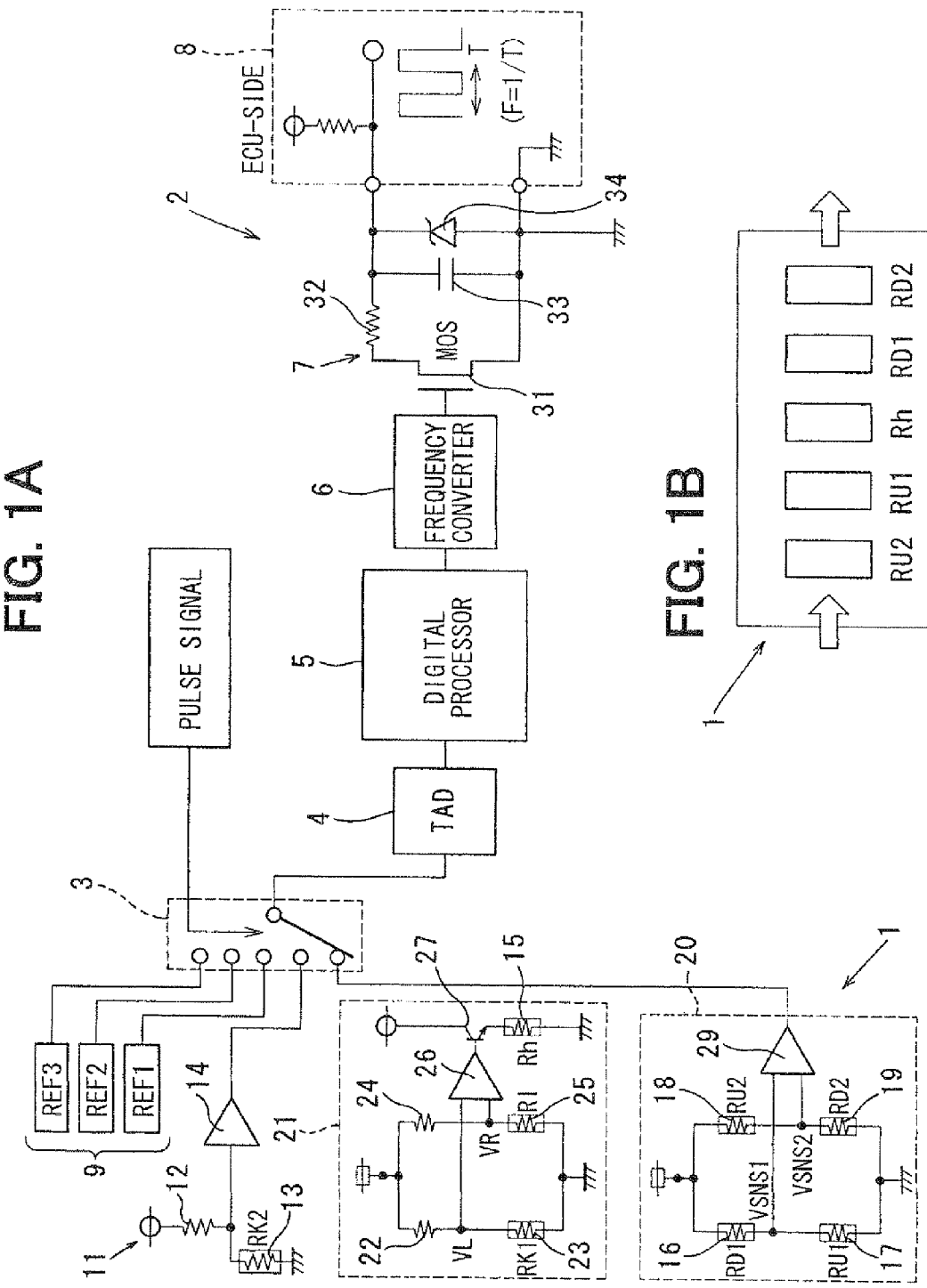
FIG. 1A is a block diagram of an engine control system according to an embodiment of the present invention.
FIG. 1B is a diagram illustrating an air flow meter of the engine control system.

Embodiments of the present invention are described below with reference to the drawings. Throughout the embodiments, the same symbols are given to the same or corresponding parts in the drawings.

An engine control system according to an embodiment of the present invention is described below with reference to FIGS. 1A-8B.

The engine control system includes an air flow measurement apparatus for calculating and measuring the air flow (i.e., intake air amount) supplied to a combustion chamber of an internal combustion engine with multiple cylinders.

The air flow measurement apparatus includes a thermal air flow meter 1 and a signal processing unit 2. The signal processing unit 2 performs analog-to digital (A/D) conversion of analog input voltage signals including a flow voltage signal and outputs a digitally corrected flow voltage signal to an engine control unit (ECU).

The signal processing unit 2 includes an analog multiplexer 3, an TAD 4, a digital processor 5, a frequency converter 6, and an output circuit 7. The analog multiplexer 3 selects any one of analog input voltage signals and outputs the selected analog input voltage signal to the TAD 4. The TAD 4 converts the analog input voltage signal received from the analog multiplexer 3 into digital data and outputs the digital data to the digital processor 5. The digital processor 5 produces a digital output signal by digitally correcting the digital data received from the TAD 4 and outputs the digital output signal to the frequency converter 6. The frequency converter 6 converts the digital output signal received from the digital processor 5 into a frequency signal and outputs the frequency signal to the output circuit 7. The output circuit 7 forwards the frequency signal received from the frequency converter 6 to a microcomputer 8 of the ECU.

Although not shown in the drawings, the signal processing unit 2 further includes a pulse signal generator for outputting a sampling control pulse signal to the analog multiplexer 3. The control pulse signal generator is incorporated in the digital processor 5. Details of the signal processing unit 2 are described later.

The analog input voltage signals inputted through the analog multiplexer 3 to the TAD 4 include a first reference voltage signal Vref1, a second reference voltage signal Vref2, a third reference voltage signal Vref3, an intake air temperature voltage signal Vt, and an air flow voltage signal Vq.

The analog multiplexer 3 has five analog switches. The reference voltage generator 9 outputs the first, second, and third reference voltage signals Vref1-Vref3 to the first, second, and third analog switches of the analog multiplexer 3, respectively. The first, second, and third reference voltage signals Vref1-Vref3 have different voltage values. For example, the reference voltage generator 9 can be a series circuit of fixed resistors. In this case, when a constant voltage Vcc is applied to one end of the series circuit, divided voltages appear at nodes between the resistors.

The TAD 4 sequentially samples the first through five analog input signals (i.e., the first reference voltage signal Vref1, the second reference voltage signal Vref2, the third reference voltage signal Vref3, the intake air temperature voltage signal Vt, and the air flow voltage signal Vq) in an order selected by the analog multiplexer 3 and converts the sampled analog signal into digital data.

The reference voltage generator 9 includes a first reference voltage source REF1 for outputting the first reference voltage signal Vref1 to the TAD 4, a second reference voltage source REF2 for outputting the second reference voltage signal Vref2 to the TAD 4, and a third reference voltage source REF3 for outputting the third reference voltage signal Vref3 to the TAD 4. The reference voltage signals Vref1-Vref3 are used for linear correction of A/D conversion characteristics of the air flow voltage signal Vq outputted from the air flow meter 1.

For example, the constant voltage Vcc can be generated by a constant voltage circuit constructed with an external power source (e.g., DC power supply, or a battery), a MOSFET, a fixed resistor, a Zener diode, a bypass capacitor (i.e., decoupling capacitor), and/or the like.

The fourth analog switch of the analog multiplexer 3 is connected to a temperature signal generator for outputting the intake air temperature voltage signal Vt. The temperature signal generator includes an intake air temperature sensor and an intake air temperature detection circuit 11. The intake air temperature sensor is mounted on a sensor chip and detects a temperature of air flow (i.e., intake air). The intake air temperature detection circuit 11 performs voltage conversion of an output signal of the intake air temperature sensor.

The intake air temperature detection circuit 11 is a series circuit of a fixed resistor 12 and a temperature detection resistor 13. The constant voltage Vcc applied to one end of the fixed resistor 12 is divided at a resistance ratio between the fixed resistor 12 and the temperature detection resistor 13 and appears at a node between the fixed resistor 12 and the temperature detection resistor 13. The divided voltage is amplified by an operational amplifier 14 and outputs as the intake air temperature voltage signal Vt to the analog multiplexer 3.

The temperature detection resistor 13 is a metal resistance thermometer, and a resistance RK2 of the temperature detection resistor changes according to an ambient temperature (i.e., intake temperature). The temperature detection resistor 13 is located on the sensor chip at a position where the temperature detection resistor 13 is not affected by heat generated by a heat generating resistor (i.e., heater) 15.

The fifth analog switch of the analog multiplexer 3 is connected to a flow signal generator for outputting the air flow voltage signal Vq to the TAD 4 of the signal processing unit 2. The flow signal generator includes a flow sensor and an air flow detection circuit 20. The flow sensor detects the amount of air flow in an intake air path in an intake air tube of the engine. The air flow detection circuit 20 performs voltage conversion of an output signal of the flow sensor.

The air flow meter 1 has the sensor chip (e.g., silicon chip, or circuit board), the heat generating resistor 15, and temperature detection resistors 16-19. The heat generating resistor 15 is mounted in the center of a thin-film portion of the sensor chip. The temperature detection resistors 16-19 are arranged on upstream and downstream sides of the heat generating resistor 15 with respect to the intake air flow direction.

A resistance Rh of the heat generating resistor 15 changes according to its temperature. When a heating current flows through the heat generating resistor 15, the heat generating resistor 15 generates heat. The heat generating resistor 15 is located in the intake air path in the intake air tube of the engine. The heating temperature of the heat generating resistor 15 is controlled by a heater temperature controller 21. The heater temperature controller 21 includes a fixed resistor 22, a temperature detection resistor 23, a fixed resistor 24, and an indirectly-heated resistor 25. The fixed resistor 22 and the fixed resistor 24 are connected in series with the temperature detection resistor 23 and the indirectly-heated resistor 25, respectively, to form a heater temperature control bridge circuit (i.e., first bridge circuit).

The temperature detection resistor 23 is a metal resistance thermometer, and a resistance RK1 of the temperature detection resistor 23 changes according to an ambient temperature (i.e., intake temperature). The temperature detection resistor 23 is located on the sensor chip at a position where the temperature detection resistor 23 is not affected by the heat generated by the heat generating resistor 15.

The indirectly-heated resistor 25 is a metal resistance thermometer, and a resistance RI of the indirectly-heated resistor 25 changes according to the heat generated by the heat generating resistor 15. The indirectly-heated resistor 25 is located on the sensor chip at a position where the indirectly-heated resistor 25 is affected by the heat generated by the heat generating resistor 15.

A predetermined power supply voltage (e.g., constant voltage of 5 volts or less) is applied to a node between the fixed resistor 22 and the fixed resistor 24 of the first bridge circuit. A node between the temperature detection resistor 23 and the indirectly-heated resistor 25 of the first bridge circuit is grounded.

The heater temperature controller 21 further includes an operational amplifier 26 and a transistor 27 in addition to the first bridge circuit. In the heater temperature controller 21, power supplied to the heat generating resistor 15 is controlled according to the intake air temperature detected by the temperature detection resistor 23 so that the temperature of the indirectly-heated resistor 25 can be greater than the intake air temperature detected by the temperature detection resistor 23 by a predetermined constant temperature.

Specially, a driving voltage for the heat generating resistor 15 is generated through the transistor 27 that operates based on the constant voltage Vcc. A first bridge output voltage (i.e., VL-VR) of the first bridge circuit is calculated by the operational amplifier 26, and the transistor 27 is feedback-controlled so that the first bridge output voltage can become a predetermined voltage value (e.g., 0 volts). The transistor 27 is feedback-controlled so that a heating temperature Th of the heat generating resistor 15 can be always greater than an ambient temperature (i.e., intake air temperature) TK by a predetermined constant temperature $\Delta T$ (=Th−TK).

In the air flow detection circuit 20, the temperature detection resistor 16 and the temperature detection resistor 18 are connected in series with the temperature detection resistor 17 and the temperature detection resistor 19, respectively, to form a flow signal detection bridge circuit (i.e., second bridge circuit).

The temperature detection resistor 16 is a metal resistance thermometer, and a resistance RD1 of the temperature detection resistor 16 changes according to its temperature. The temperature detection resistor 16 is located on the downstream side of the heat generating resistor 15 in an intake air flow direction. The temperature detection resistor 16 forms a downstream side first temperature sensor for detecting a downstream temperature at a position near the heat generating resistor 15.

The temperature detection resistor 17 is a metal resistance thermometer, and a resistance RU1 of the temperature detection resistor 17 changes according to its temperature. The temperature detection resistor 17 is located on the upstream side of the heat generating resistor 15 in the intake air flow direction. The temperature detection resistor 17 forms an upstream side first temperature sensor for detecting an upstream temperature at a position near the heat generating resistor 15.

The temperature detection resistor 18 is a metal resistance thermometer, and a resistance RU2 of the temperature detection resistor 18 changes according to its temperature. The temperature detection resistor 18 is located on the upstream side of the temperature detection resistor 17 in the intake air flow direction. The temperature detection resistor 18 forms an upstream side second temperature sensor for detecting an upstream temperature at a position near the heat generating resistor 15.

The temperature detection resistor 19 is a metal resistance thermometer, and a resistance RD2 of the temperature detection resistor 19 changes according to its temperature. The temperature detection resistor 19 is located on the downstream side of the temperature detection resistor 16 in the intake air flow direction. The temperature detection resistor 19 forms a downstream side second temperature sensor for detecting a downstream temperature at a position near the heat generating resistor 15.

The predetermined power supply voltage (e.g., constant voltage of 5 volts or less) is applied to a node between the temperature detection resistor 16 and the temperature detection resistor 18 of the second bridge circuit. A node between the temperature detection resistor 17 and the temperature detection resistor 19 of the second bridge circuit is grounded.

The air flow detection circuit 20 further includes an operational amplifier 29 in addition to the second bridge circuit. In the air flow detection circuit 20, a second bridge output voltage (i.e., VSNS1-VSNS2) of the second bridge circuit is calculated and amplified by the operational amplifier 29, and the amplified second bridge output voltage is outputted as the air flow voltage signal Vq to the analog multiplexer 3.

How to detect the amount and the direction of air flow is described below.

Under no air flow conditions, the temperature distribution becomes symmetric with respect to the heat generating resistor 15. Since the temperature detection resistors 16, 17 are symmetrically located with respect to the heat generating resistor 15, the amount of heat transmitted to the temperature detection resistor 16 becomes equal to the amount of heat transmitted to the temperature detection resistor 17. Likewise, since the temperature detection resistors 18, 19 are symmetrically located with respect to the heat generating resistor 15, the amount of heat transmitted to the temperature detection resistor 18 becomes equal to the amount of heat transmitted to the temperature detection resistor 19. Therefore, the resistance RD1 of the temperature detection resistor 16 becomes equal to the resistance RU1 of the temperature detection resistor 17, and the resistance RU2 of the temperature detection resistor 18 becomes equal to the resistance RD2 of the temperature detection resistor 19. As a result, under no air flow conditions, a potential VSNS1 at the node between the temperature detection resistors 16, 17 becomes equal to a potential VSNS2 at the node between the temperature detection resistors 18, 19 so that a difference in the potentials VSNS1, VSNS2 can be zero.

As shown in FIG. 1B, when the air flows from the upstream side (air cleaner side) to the downstream side (engine side), the center of the temperature distribution moves to the downstream side of the heat generating resistor 15. In this case, since the temperature detection resistors 17, 18 are located on the upstream side of the heat generating resistor 15, the temperatures of the temperature detection resistors 17, 18 become lower than the heat generating resistor 15. In contrast, since the temperature detection resistors 16, 19 are located on the downstream side of the heat generating resistor 15, the temperatures of the temperature detection resistors 16, 19 become higher than the heat generating resistor 15. As a result, for example, the resistances RU1, RU2 of the temperature detection resistors 17, 18 decrease, and the resistances RD1, RD2 of the temperature detection resistors 16, 19 increase. Therefore, the potential difference VSNS2−VSNS1 is not zero and has a positive value.

Conversely, when the air flows from the downstream side to the upstream side, the center of the temperature distribution moves to the upstream side of the heat generating resistor 15. As a result, for example, the resistances RU1, RU2 of the temperature detection resistors 17, 18 increase, and the resistances RD1, RD2 of the temperature detection resistors 16, 19 decrease. Therefore, the potential difference VSNS2−VSNS1 is not zero and has a negative value.

In this way, the potential difference VSNS2−VSNS1 has a positive value or a negative value depending on the direction of air flow. Therefore, the direction of air flow can be detected by determining whether the potential difference VSNS2−VSNS1 has a positive value or a negative value. Further, when the amount of air flow is large, the temperature distribution varies largely. In this case, the resistances RD1, RU1, RU2, RD2 of the temperature detection resistors 16-19 vary largely according to the variation of the temperature distribution. As a result, the potential difference VSNS2−VSNS1 varies largely. That is, there is correlation between the amount of air flow and the potential difference VSNS2−VSNS1. Therefore, the amount of air flow can be detected by measuring an absolute value of the potential difference VSNS2−VSNS1.

Next, the signal processing unit 2 is described in detail below with reference to FIGS. 1-4.

As mentioned previously, the signal processing unit 2 includes the analog multiplexer 3, the TAD 4, the digital processor 5, the frequency converter 6, and the output circuit 7.

The analog multiplexer 3 includes five analog switches and selects any one of the first through fifth analog input voltage signals (i.e., the first reference voltage signal Vref1, the second reference voltage signal Vref2, the third reference voltage signal Vref3, the intake air temperature voltage signal Vt, and the air flow voltage signal Vq) in accordance with a SW switching signal (i.e., sampling control pulse signal) that is outputted with a predetermined period (i.e., sampling period) from the control pulse signal generator incorporated in the digital processor 5.

Each time the analog multiplexer 3 outputs any one of the first reference voltage signal Vref1, the second reference voltage signal Vref2, the third reference voltage signal Vref3, the intake air temperature voltage signal Vt to the TAD 4 in response to the sampling control pulse signal, the analog multiplexer 3 outputs the air flow voltage signal Vq to the TAD 4.

The TAD 4 includes a pulse delay circuit, a latch/encoder circuit, a counter circuit, and a latch circuit. The pulse delay circuit causes a start pulse to circulate. The latch/encoder circuit detects (i.e., latches) a position of the start pulse in the pulse delay circuit at the time of the rising edge (or falling edge) of the sampling pulse control signal. Further, the latch/encoder circuit converts the detected position into digital data of a predetermined number of bits. The digital data indicates the number of delay units, counted from the initial delay unit start, the start pulse passed though. The counter circuit counts how many times the start pulse circulates in the pulse delay circuit. The latch circuit latches a value of the counter circuit at the time of the rising edge (or falling edge) of the sampling pulse control signal.

The TAD 4 is activated in response to the start pulse, which is inputted from an external control circuit such as a central processing unit (CPU).

The TAD 4 has an input voltage range from a minimum voltage Vmin to a maximum voltage Vmax. The TAD 4 converts an input voltage within the input voltage range into digital data. It is noted that a center voltage Vc is an intermediate value between the minimum voltage Vmin and the maximum voltage Vmax. The TAD 4 sequentially receives and converts the three reference voltage signals Vre1-Vref3 into digital data and derives a linear correction formula based on the digital data as described later.

The control pulse signal generator outputs the sampling control pulse signal to the analog multiplexer 3 at a sampling period at which the TAD 4 samples the first through fifth analog input voltage signals (i.e., the first reference voltage signal Vref1, the second reference voltage signal Vref2, the third reference voltage signal Vref3, the intake air temperature voltage signal Vt, and the air flow voltage signal Vq).

Further, the control pulse signal generator provides a sampling timing setting section for setting a sampling timing at which the TAD 4 samples the first reference voltage signal Vref1, the second reference voltage signal Vref2, the third reference voltage signal Vref3, the intake air temperature voltage signal Vt, and the air flow voltage signal Vq.

The sampling timing setting section interposes a sampling timing of the air flow voltage signal Vq between sampling timings of each successive analog input signals. Thus, each time the analog multiplexer 3 outputs any one of the first reference voltage signal Vref1, the second reference voltage signal Vref2, the third reference voltage signal Vref3, the intake air temperature voltage signal Vt to the TAD 4, the analog multiplexer 3 outputs the air flow voltage signal Vq to the TAD 4.

Figure 2:
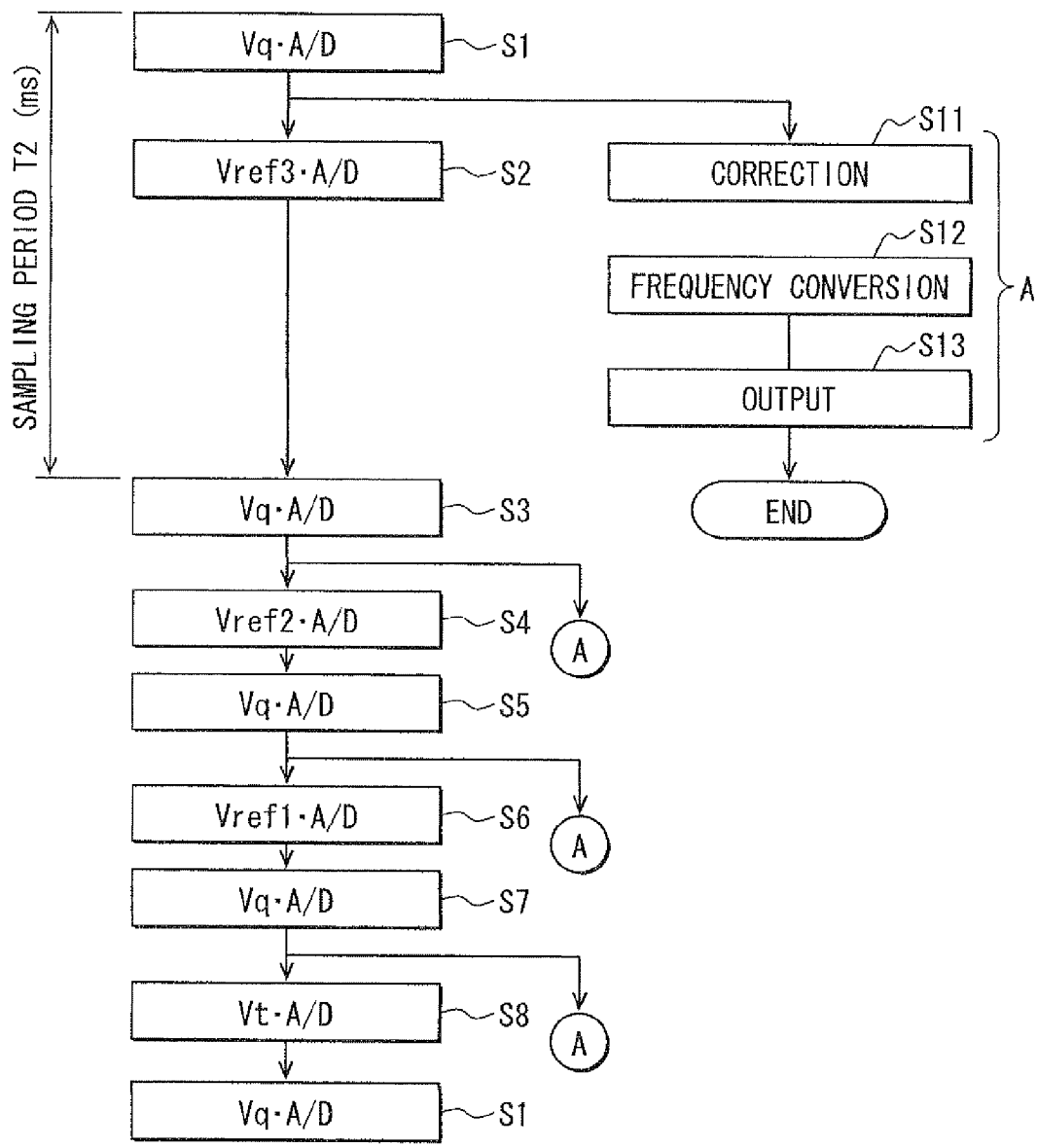
FIG. 2 is a flow chart of a signal processing unit of the engine control system.
Figure 3:
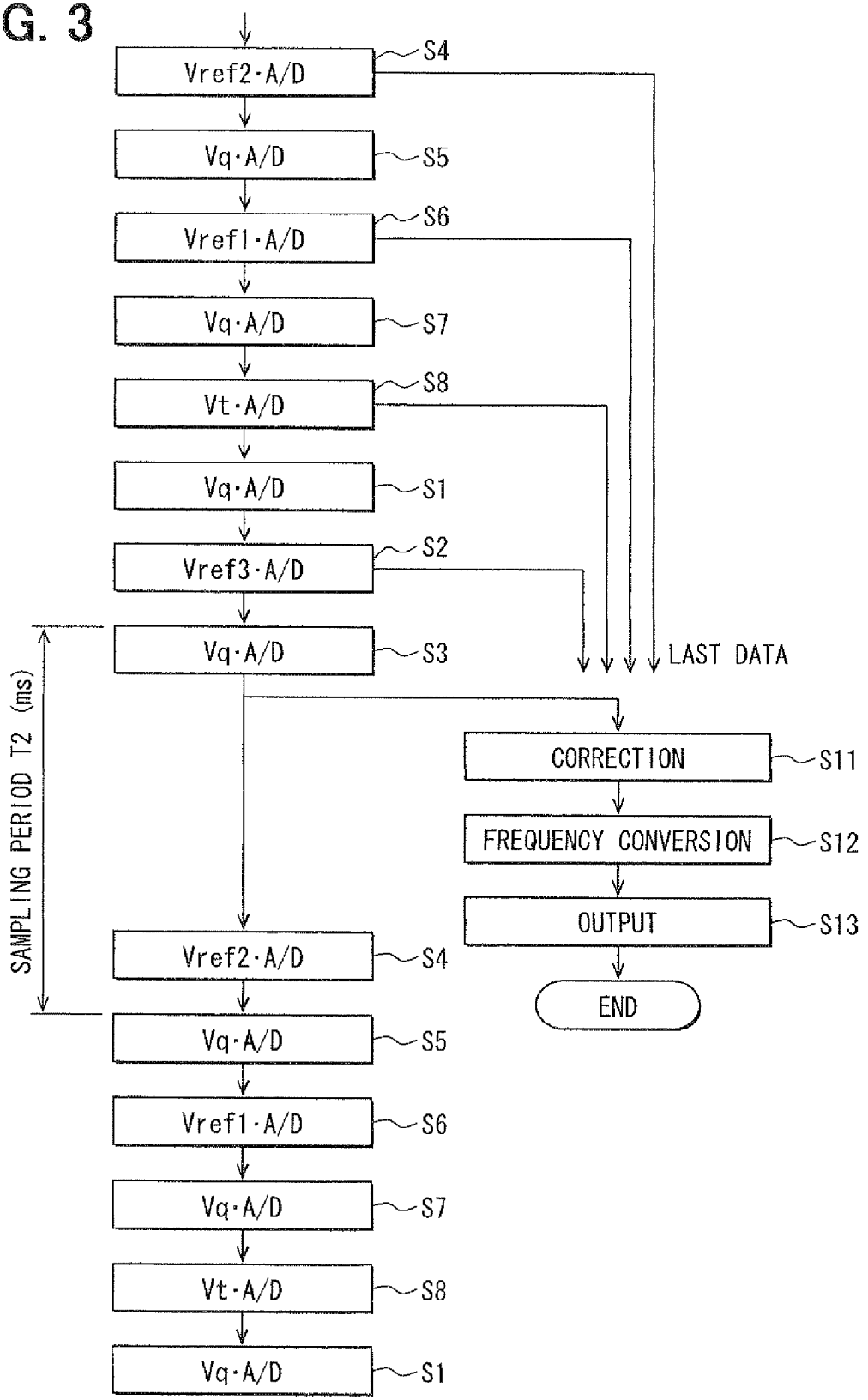
FIG. 3 is a flow chart following the flow chart of FIG. 2.

In an example shown in FIGS. 2 and 3, the sampling timing of the air flow voltage signal Vq is interposed between the third reference voltage signal Vref3 and the second reference voltage signal Vref2. Further, the sampling timing of the air flow voltage signal Vq is interposed between the second reference voltage signal Vref2 and the first reference voltage signal Vref1. Furthermore, the sampling timing of the air flow voltage signal Vq is interposed between the first reference voltage signal Vref1 and the intake air temperature voltage signal Vt. Furthermore, the sampling timing of the air flow voltage signal Vq is interposed between the intake air temperature voltage signal Vt and the third reference voltage signal Vref3.

Thus, each time the analog multiplexer 3 outputs any one of the first reference voltage signal Vref1, the second reference voltage signal Vref2, the third reference voltage signal Vref3, and the intake air temperature voltage signal Vt to the TAD 4, the analog multiplexer 3 outputs the air flow voltage signal Vq to the TAD 4. In such an approach, as can be seen by comparing FIG. 2 and FIG. 10, a sampling period T2, with which the air flow voltage signal Vq is sampled, of the embodiment can be smaller than the sampling period T1 of the related art. For example, the sampling period T2 can be about one-half to about one-third of the sampling period T1.

The digital processor 5 includes a liner correction section and a temperature dependence correction section. The liner correction section sets the liner correction formula and performs a linear correction of A/D conversion characteristics of the output of the TAD 4 based on the liner correction formula. The temperature dependence correction section corrects a dependence of the air flow voltage signal Vq on temperature.

The frequency converter 6 converts digital data outputted from the digital processor 5 into a frequency signal.

The output circuit 7 includes an N-channel MOSFET 31, a fixed resistor 32, a bypass capacitor ((i.e., decoupling capacitor), and a Zener diode 34. The output circuit 7 outputs the frequency signal, which is outputted form the frequency converter 6, to the microcomputer 8 of the ECU.

The microcomputer 8 can be a typical microcomputer having a central processing unit (CPU) and memory devices such as a read only memory (ROM) and a random access memory (RAM). The ECU is configured so that the air flow voltage signal Vq outputted from the signal processing unit 2 can be inputted to the microcomputer 8. Further, the ECU is configured so that sensor signals outputted from sensors (not shown) can be inputted to the microcomputer 8 after being converted into digital data by another A/D converter (not shown).

An A/D conversion method according to the signal processing unit 2 is described below with reference to FIGS. 1-8.

FIGS. 2 and 3 are flow charts illustrating the sampling timings of the five analog input signals (i.e., the first reference voltage signal Vref1, the second reference voltage signal Vref2, the third reference voltage signal Vref3, the intake air temperature voltage signal Vt, and the air flow voltage signal Vq).

When the TAD 4 starts an A/D conversion process, the analog switches of the analog multiplexer 3 are controlled so that the analog multiplexer 3 switches to the third reference voltage signal Vref. Thus, the third reference voltage signal Vref3 is inputted to and sampled by the TAD 4. Then, the third reference voltage signal Vref3 is converted into digital data, and the digital data corresponding to the third reference voltage signal Vref3 is stored in a digital data storing circuit (hereinafter called the "register") of the digital processor 5 at step S2.

The second reference voltage signal Vref2, the first reference voltage signal Vref1, and the intake air temperature voltage signal Vt are processed in the same manner as the third reference voltage signal Vref3 at step S4, S6, and S8, respectively.

Thus, digital data corresponding to the third reference voltage signal Vref3, the second reference voltage signal Vref2, the first reference voltage signal Vref1, and the intake air temperature voltage signal Vt are stored in the register of the digital processor 5.

The routine shown in FIGS. 2 and 3 is repeated with a predetermined period.

Firstly, at step S1, the analog switches of the analog multiplexer 3 are controlled so that the analog multiplexer 3 can switch to the air flow voltage signal Vq. Thus, the air flow voltage signal Vq is inputted to and sampled by the TAD 4. Then, the air flow voltage signal Vq is converted into digital data, and the digital data corresponding to the air flow voltage signal Vq is stored in the register of the digital processor 5. After step S1, step S2 is performed so that the third reference voltage signal Vref3 can be processed in a manner as described above. Further, a task A including steps S11, S12, and S13 is performed in parallel with step S2.

At step S11, the digital processor 5 performs signal processing including a linear correction and an output variation correction on the digital data, corresponding to the air flow voltage signal Vq, outputted from the TAD 4.

At step S12, the frequency converter 6 converts the corrected digital data, outputted from the digital processor 5, into a frequency signal.

At step S13, the output circuit 7 outputs the frequency signal, outputted from the frequency converter 6, to the microcomputer 8 of the ECU.

The microcomputer 8 calculates the amount of air flow (i.e., intake air flow) based on a frequency F of the frequency signal.

Then, after step S2, step S3 is performed in the same manner as step S1. Further, the task A including steps S11, S12, and S13 is performed in parallel with step S3. In the task A, the signal processing is performed by using last temperature voltage data and the last reference voltage data. The last temperature voltage data corresponds to the temperature voltage signal Vt that is sampled immediately before the air flow voltage signal Vq corresponding to the present air flow voltage data is sampled. The last reference voltage data corresponds to the reference voltage signals Vref3-Vref1 that are sampled immediately before the air flow voltage signal Vq corresponding to the present air flow voltage data is sampled. The last data are stored in the register.

After step S3, step S4 is performed. At step S4, the analog switches of the analog multiplexer 3 are controlled so that the analog multiplexer 3 can switch to the second reference voltage signal Vref2. Thus, the second reference voltage signal Vref2 is inputted to and sampled by the TAD 4. Then, the second reference voltage signal Vref2 is converted into digital data, and the digital data corresponding to the second reference voltage signal Vref2 is stored in the register of the digital processor 5. Further, the task A including steps S11, S12, and S13 is performed in parallel with step S4. Then, after step S4, step S5 is performed in the same manner as step S1.

After step S5, step S6 is performed. At step S6, the analog switches of the analog multiplexer 3 are controlled so that the analog multiplexer 3 can switch to the first reference voltage signal Vref1. Thus, the first reference voltage signal Vref1 is inputted to and sampled by the TAD 4. Then, the first reference voltage signal Vref1 is converted into digital data, and the digital data corresponding to the first reference voltage signal Vref1 is stored in the register of the digital processor 5. Further, the task A including steps S11, S12, and S13 is performed in parallel with step S6. Then, after step S6, step S7 is performed in the same manner as step S1.

After step S7, step S8 is performed. At step S8, the analog switches of the analog multiplexer 3 are controlled so that the analog multiplexer 3 can switch to the intake air temperature voltage signal Vt. Thus, the intake air temperature voltage signal Vt is inputted to and sampled by the TAD 4. Then, the intake air temperature voltage signal Vt is converted into digital data, and the digital data corresponding to the intake air temperature voltage signal Vt is stored in the register of the digital processor 5. Further, the task A including steps S11, S12, and S13 is performed in parallel with step S8. Then, after step S8, step S1 is performed. In this way, steps S1-S8 are repeated. As mentioned above, in the task A, the signal processing is performed by using last data stored in the register.

The linear correction performed by the digital processor 5 is described in detail below.

The digital processor 5 includes a control pulse generator, a memory section (e.g., EEPROM, RAM, or register), and a correction logic section. The control pulse generator generates and outputs the sampling control signal. The memory section temporarily stores an output of the TAD 4 (i.e., digital data corresponding to of the air flow voltage signal Vq). The correction logic section sets the liner correction formula based on the content of the air flow voltage signal Vq and performs the linear correction of A/D conversion characteristics of the output of the TAD 4 based on the liner correction formula.

The control pulse generator outputs a command for sequentially switching the analog switches of the analog multiplexer 3 so that the digital data corresponding to the minimum voltage Vmin, the center voltage Vc, and the maximum voltage Vmax can be stored in respective portions of the memory section. The digital data corresponding to the minimum voltage Vmin is hereinafter called the "data MIN". The digital data corresponding to the center voltage Vc is hereinafter called the "data C". The digital data corresponding to the maximum voltage Vmax is hereinafter called as the "data MAX".

The correction logic section includes a correction formula setting portion and a correction calculating portion. The correction formula setting portion sets the liner correction formula. The correction calculating portion performs the linear correction of the output of the TAD 4 based on the liner correction formula. Specifically, the correction formula setting portion sets the liner correction formula based on the data MIN, the data C, and the data MAX stored in the memory section. How to determine the liner correction formula is described in detail below with reference to FIG. 4.

Figure 4:
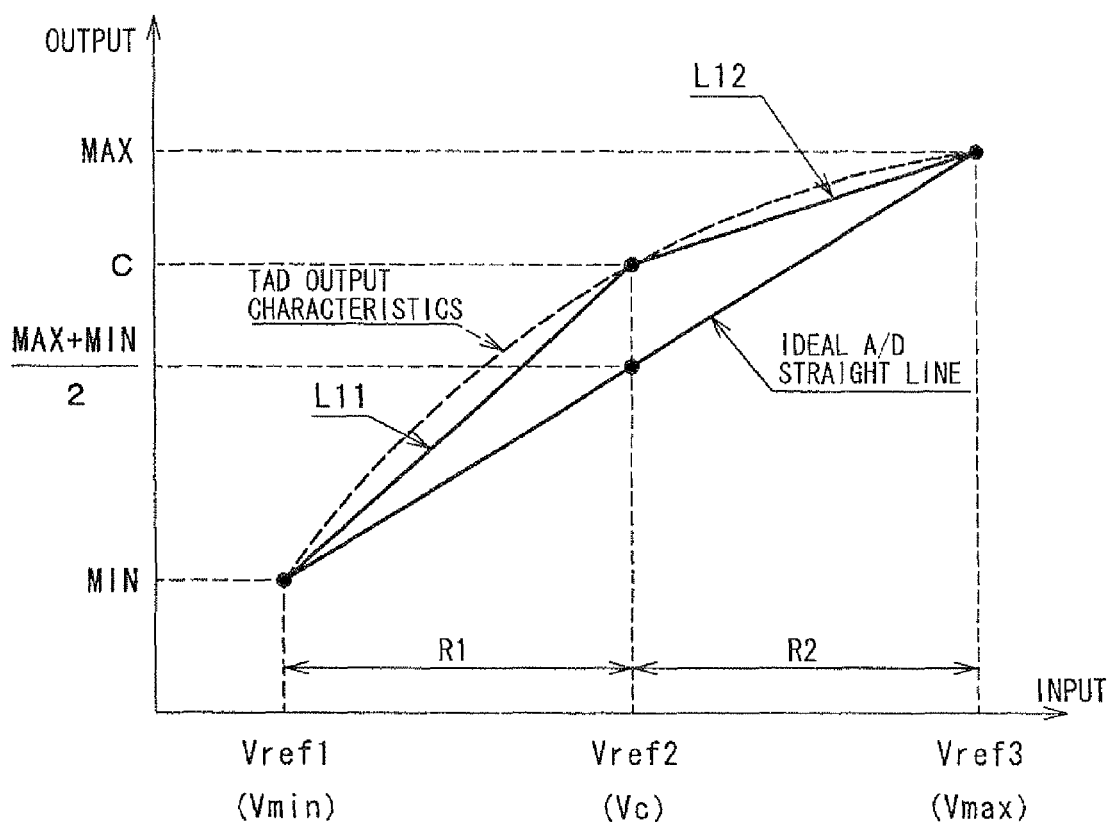
FIG. 4 is a diagram illustrating output characteristics of a TAD of the signal processing unit.

FIG. 4 illustrates input-output characteristics (i.e., A/D conversion characteristics) of the TAD 4. In FIG. 4, the horizontal axis represents an analog input voltage to the TAD 4, and the vertical axis represents a digital output of the TAD 4. As indicated by a broken line in FIG. 4, the A/D conversion characteristics are represented as a nonlinear curve. The nonlinear A/D conversion characteristics results in a reduction in accuracy of a final sensor output.

To prevent the reduction in accuracy, according to the embodiment, the input voltage range from the minimum voltage Vmin to the maximum voltage Vmax is equally divided into two regions R1 and R2. The first region R1 is from the minimum voltage Vmin to the center voltage Vc, and the second region R2 is from the center voltage Vc to the maximum voltage Vmax.

In the first region R1, the nonlinear curve representing the A/D conversion characteristics is approximated to a first approximate line L11 that connects a first coordinate point indicating a digital output (i.e., data MIN) corresponding to the minimum voltage Vmin to a second coordinate point indicating a digital output (i.e., data C) corresponding to the center voltage Vc. In the second region R2, the nonlinear curve representing the A/D conversion characteristics is approximated to a second approximate line L12 that connects the second coordinate point to a third coordinate point indicating a digital output (i.e., data MAX) corresponding to the maximum voltage Vmax.

An ideal A/D line straightly connecting the first coordinate point to the third coordinate point is determined. The points on the first and second approximate lines L11, L12 are converted into corresponding points on the ideal A/D line in accordance with the linear correction formula.

A method of determining the liner correction formula is described below with reference to FIG. 5.

Figure 5:
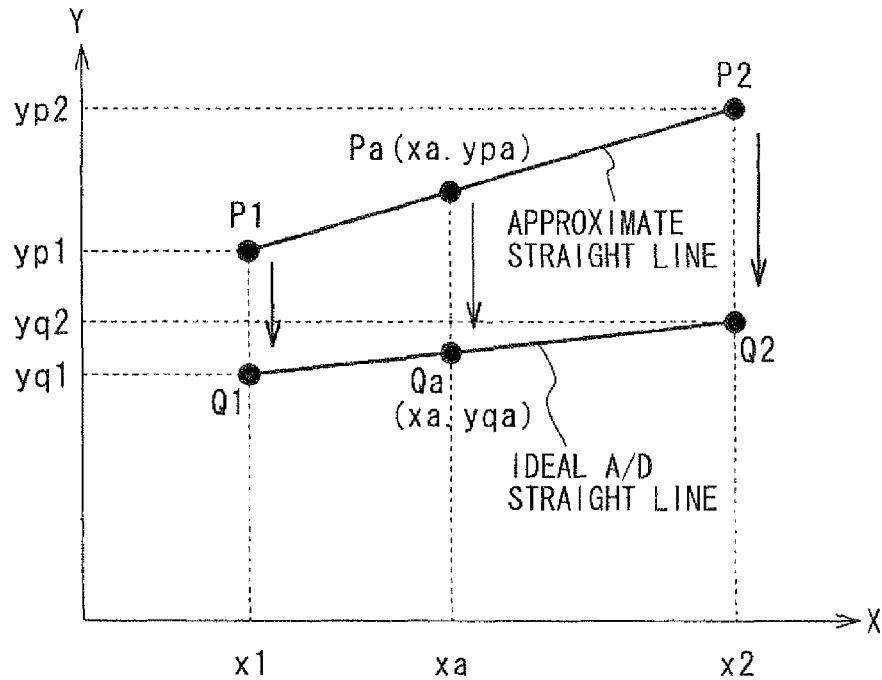
FIG. 5 is a diagram illustrating a linear correction to correct the output characteristic.

In an example shown in FIG. 5, an approximate line connects a coordinate point $P1(x1, yp1)$ to a coordinate point $P2(x2, yp2)$, and an ideal A/D line connects a coordinate point $Q1(x1, yq1)$ to a coordinate point $Q2(x2, yq2)$. The points P1, P2 on the approximate line are converted into the respective points Q1, Q2, and a given point $Pa(xa, xpa)$ on the approximate line is converted into a point $Qa(xa, yqa)$ on the ideal A/D line. The approximate line and the ideal A/D conversion line have a proportional relationship given by an equation 1:

$$(ypa-yp1):(yp2-ypa)=(yqa-yq1):(yq2-yqa) \quad \text{[EQUATION 1]}$$

From the equation 1, an equation 2 below is obtained:

$$yqa=(ypa-yp1)\cdot\{(yq2-yq1)/(yp2-yp1)\}yq1 \quad \text{[EQUATION 2]}$$

Referring back to FIG. 4, at each end of the regions R1, R2, conversion from the approximate line to the ideal A/D line is performed in accordance with a map below: [MAP]

|  | APPROXIMATE LINE | IDEAL A/D LINE |
|---|---|---|
| REGION R1 | MIN | → MIN |
|  | C | → (MAX + MIN)/2 |
| REGION R2 | C | → (MAX + MIN)/2 |
|  | MAX | → MAX |

From the equation 2 and the map, equations 3 and 4 below are obtained:

[Equation 3]
In the case of the region R1 and MIN≦X≦C:

$$H=(X-\text{MIN})\cdot\{\{(\text{MAX}+\text{MIN})/2-\text{MIN}\}/(C-\text{MIN})\}+\text{MIN}$$

[Equation 4]
In the case of the region R2 and C<X≦MAX:

$$H=(X-C)\cdot\{\{\text{MAX}-(\text{MAX}+\text{MIN})/2\}/(\text{MAX}-C)\}+(\text{MAX}+\text{MIN})/2$$

Thus, TAD output data X on the approximate line can be converted to corrected data on the ideal A/D line. That is, the equations 3 and 4 form the linear correction formula.

Thus, the TAD output data X (i.e., digital data corresponding to the air flow voltage signal Vq) outputted from the TAD 4 is corrected to the corrected data H by the digital processor 5. Specifically, the correction formula setting portion determines the above equations 3 and 4 (i.e., the linear correction formula) by reading the data MIN, the data C, and the data MAX from the register.

The correction calculating portion applies the linear correction to the TAD output data X stored in the register in accordance with the linear correction formula determined by the correction formula setting portion, so that the TAD output data X can be corrected to the corrected data H.

It is noted that the linear correction formula is determined based on the data MIN, the data C, and the data MAX by inputting the reference voltage signals Vmin, Vmax, and Vc to the TAD 4 before the TAD 4 starts A/D conversion of the air flow voltage signal Vq.

Next, a temperature dependence correction (i.e., output variation correction) performed by the digital processor 5 is described below.

The air flow voltage signal Vq outputted from the air flow detection circuit 20 varies depending on the ambient temperature, even when the air flow is constant. That is, the air flow voltage signal Vq has temperature dependence. According to the embodiment, a temperature dependence correction is applied to the air flow voltage data or the linearly corrected air flow voltage data by using the temperature voltage data, so that the air flow voltage data can be corrected to a corrected voltage VDr corresponding to a reference temperature (e.g., 20° C.). In an example shown in FIG. 6, voltage data VD1 corresponding to air flow G2 at an intake air temperature of 130° C. can be converted into voltage data VD2 corresponding to the air flow G2 at the intake air temperature of 20° C. This temperature dependence correction is performed based on temperature dependence specific to the flow sensor.

Figure 6:
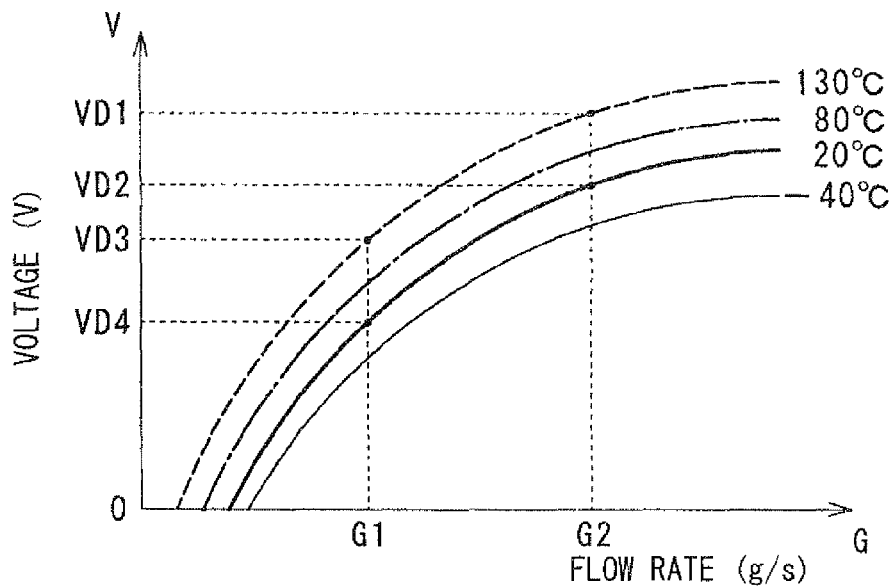
FIG. 6 is a diagram illustrating a temperature dependence of a relationship between flow rate and voltage.

However, the temperature dependence varies depending on the air flow. That is, as shown in FIG. 6, a difference between the voltage data VD1 corresponding to the air flow G2 at the intake air temperature of 130° C. and the voltage data VD2 corresponding to the air flow G2 at the intake air temperature of 20° C. is different than a difference between voltage data VD3 corresponding to air flow G1 at the intake air temperature of 130° C. and voltage data VD4 corresponding to the air flow G1 at the intake air temperature of 20° C. Therefore, a correction factor for correcting the voltage data VD1 to the voltage data VD2 is different from a correction factor for correcting the voltage data VD3 to the voltage data VD4.

Figure 7A:
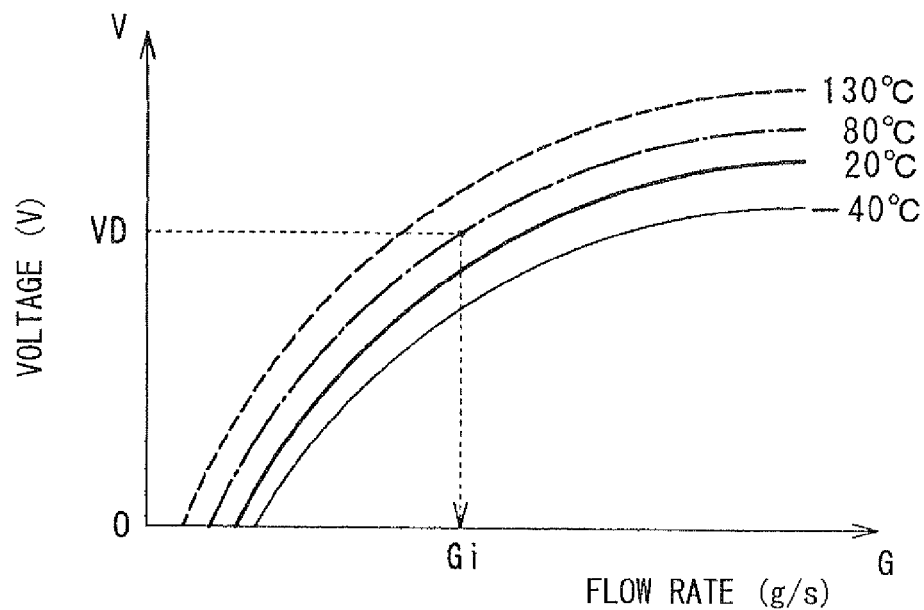
FIGS. 7A and 7B are diagrams illustrating how to correct the temperature dependence.
Figure 7B:
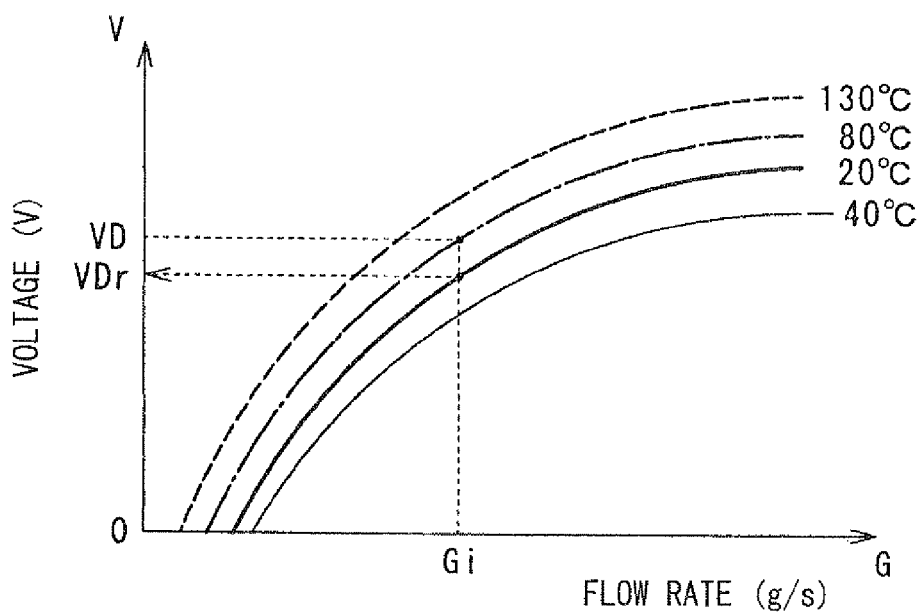

According to the embodiment, as shown in FIG. 7A, air flow Gi is calculated from voltage data VD and the intake air temperature. The voltage data VD is the air flow voltage data or the linearly corrected air flow voltage data. Then, as shown in FIG. 7B, a correction factor Ki is calculated from the air flow Gi and the intake air temperature, and the voltage data VD is corrected to the corrected voltage VDr based on the correction factor Ki. The intake air temperature is inputted as the temperature voltage data VDt from the intake air temperature sensor.

Specifically, the correction factor Ki is calculated by referring to two tables shown in FIGS. 8A and 8B.

Assuming that a voltage corresponding to air flow at a reference temperature is Va and that a voltage corresponding to the air flow at a certain temperature is Vb, the correction factor Ki is calculated by a equation 5 below:

$$Ki = Vb/Va \qquad \text{[EQUATION 5]}$$

The tables shown in FIGS. 8A and 8B are created based on the temperature dependence of the flow sensor and prestored in a ROM such as EEPROM of the digital processor 5. Since the temperature dependence varies from flow sensor to flow sensor, the tables are created for each flow sensor.

The first table shown in FIG. 8A defines the air flow Gi corresponding to the input voltage VD at the intake air temperature Ta. Thus, the air flow Gi corresponding to the input voltage VD at the intake air temperature Ta can be calculated by referring to the first table shown in FIG. 8A. In the first table, each of the input voltage and the intake air temperature has discrete values. From data size and accuracy improvement standpoints, it is preferable that each of the input voltage and the intake air temperature have about five to ten discrete values.

The second table shown in FIG. 8B defines the correction factor Ki corresponding to the air flow Gi at the intake air temperature Ta. Thus, the correction factor Ki corresponding to the air flow Gi at the intake air temperature Ta can be calculated by referring to the second table shown in FIG. 8B. In the second table, each of the air flow and the intake air temperature has discrete values. From data size and accuracy improvement standpoints, it is preferable that each of the air flow and the intake air temperature have about five to ten discrete values.

The digital processor 5 corrects the voltage data VD to the corrected voltage data VDr in accordance with an equation 6 below:

$$VDr = VD/Ki \qquad \text{[EQUATION 6]}$$

Advantages of the embodiment can be summarized below.

According to the embodiment, each time the analog multiplexer 3 outputs any one of the first reference voltage signal Vref1, the second reference voltage signal Vref2, the third reference voltage signal Vref3, and the intake air temperature voltage signal Vt to the TAD 4, the analog multiplexer 3 outputs the air flow voltage signal Vq to the TAD 4. This is based on the fact that a change in the air flow voltage signal Vq with respect to time is larger than a change in each of the other signals with respect to time.

Specifically, the sampling timing at which the air flow voltage signal Vq is sampled by the TAD 4 is interposed between the sampling timings at which each successive two of the temperature voltage signal Vt and the reference voltage signals Vref1-Vref3 are sampled by the TAD 4. For example, the sampling timing at which the air flow voltage signal Vq is sampled can be interposed between the sampling timings at which the reference voltage signals Vref3, Vref2, between the sampling timings at which the reference voltage signals Vref2, Vref1, between the reference voltage signal Vref1 and the intake air temperature voltage signal Vt, and between the intake air temperature voltage signal Vt and the reference voltage signal Vref3. In such an approach, during one cycle of the switching of the analog switches of the analog multiplexer 3, while the reference voltage signals Vref1-Vref3 and the intake air temperature voltage signal Vt are sampled once, the air flow voltage signal Vq is sampled multiple times. Each time the air flow voltage signal Vq is sampled, the sampled air flow voltage signal Vq is converted into the air flow voltage data and stored as the present (i.e., new) data in the register.

Thus, each time the analog multiplexer 3 outputs any one of the first reference voltage signal Vref1, the second reference voltage signal Vref2, the third reference voltage signal Vref3, and the intake air temperature voltage signal Vt to the TAD 4, the analog multiplexer 3 outputs the air flow voltage signal Vq to the TAD 4.

Figure 10:
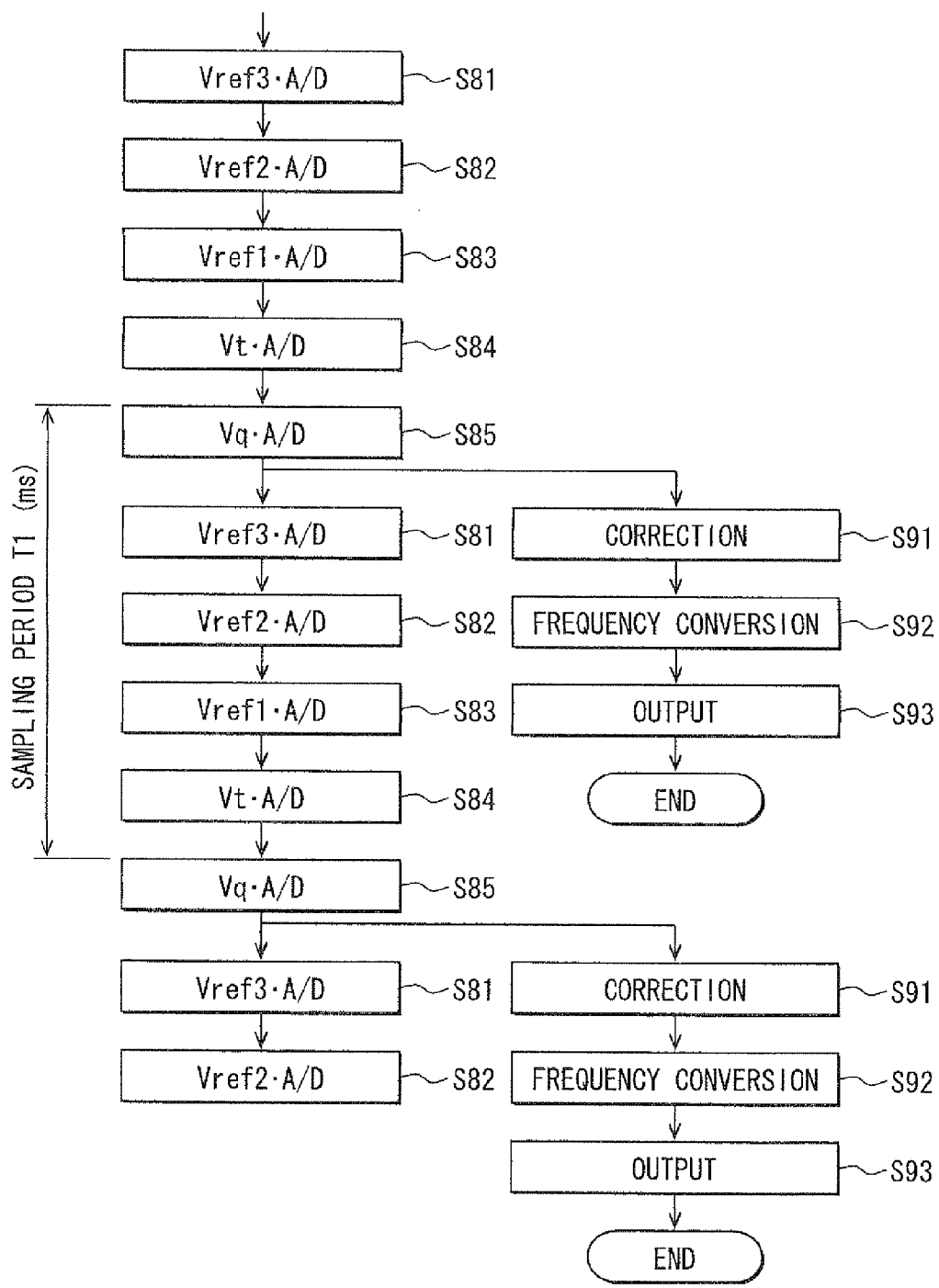
FIG. 10 is a flow chart of a signal processing unit of the related art.

In such an approach, as can be seen by comparing FIG. 2 and FIG. 10, the sampling period T2, with which the air flow voltage signal Vq is sampled, of the embodiment can be smaller than the sampling period T1 of the related art. For example, the sampling period T2 can be about one-half to about one-third of the sampling period T1.

Further, according to the embodiment, the digital processor 5 applies the correction processing to the present air flow voltage data using last temperature voltage data and the last reference voltage data. The last temperature voltage data corresponds to the temperature voltage signal Vt that is sampled immediately before the air flow voltage signal Vq corresponding to the present air flow voltage data is sampled. The last reference voltage data corresponds to the reference voltage signals Vref3-Vref1 that are sampled immediately before the air flow voltage signal Vq corresponding to the present air flow voltage data is sampled.

In such an approach, accuracy with which the correction processing is applied can be ensured. A reason for this is that the change in the air flow voltage signal Vq with respect to time is larger than the change in each of the other signals with respect to time. Specifically, the air flow voltage signal Vq changes from moment to moment, because a frequency of intake air pulsation changes with engine rotation speed. Compared to the air flow voltage signal Vq, the reference voltage signals Vref1-Vref3 and the temperature voltage signal Vt change little with time. Therefore, the accuracy can be ensured by applying the correction processing to the present air flow voltage data using the last temperature voltage data and the last reference voltage data.

As described above, the sampling timing at which the air flow voltage signal Vq is sampled by the TAD 4 is interposed between the sampling timings at which each successive two of the temperature voltage signal Vt and the reference voltage signals Vref1-Vref3 are sampled by the TAD 4.

Thus, the sampling period T2, with which the air flow voltage signal Vq is sampled, of the embodiment can be smaller than the sampling period T1 of the related art.

Figure 9A:
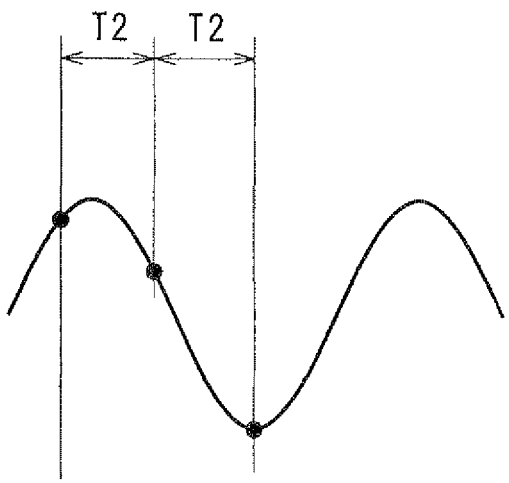
FIG. 9A is a diagram illustrating a relationship between intake air pulsation and a sampling period with which an air flow voltage signal is sampled by the TAD of the embodiment.
Figure 9B:
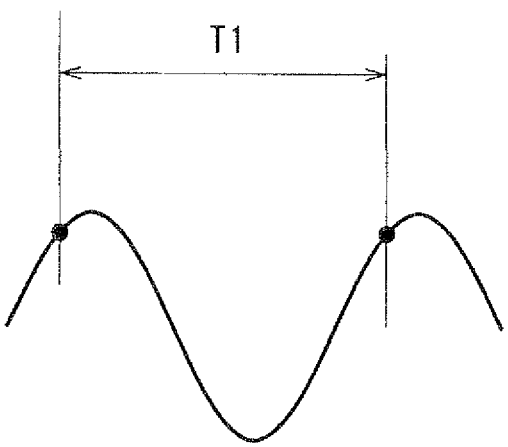
FIG. 9B is a diagram illustrating a relationship between the intake air pulsation and a sampling period with which an air flow voltage signal is sampled by a TAD of a related art.

For example, as shown in FIG. 9A, the sampling period T2 can be shorter than a period of high frequency pulsation in an intake air passage. In such an approach, the air flow measurement apparatus according to the embodiment can surely follow the change in the air flow under high frequency pulsation.

The frequency of intake air pulsation changes with engine rotation speed. Therefore, it is preferable to adjust the sampling period with which the air flow voltage signal Vq is sampled according to the engine rotation speed, so that a sampling frequency of the air flow voltage signal Vq can be greater than the frequency of intake air pulsation.

(Modification)

The above embodiment can be modified in various way, for example, as follows.

In the embodiment, the temperature detection resistors are placed on both sides of the heat generating resistor, and the air flow is measured by detecting the difference in temperature between the temperature detection resistors. Alternatively, the temperature of the heat generating resistor can be controlled so that a difference in temperature between the heat generating resistor and a temperature compensating resistor can be a predetermined value, and the air flow can be measured by detecting the heating current flowing through the heat generating resistor.

In the embodiment, the linear correction formula is determined by using three reference voltage signals Vrfe1, Vref2, and Vref3. Alternatively, the linear correction formula can be determined by using four or more reference voltage signals. In such an approach, the linear correction accuracy can be improved.

In the embodiment, the intake air temperature voltage signal Vt is inputted to the TAD4 and then stored in the register. Alternatively, the input of the intake air temperature voltage signal Vt to the TAD4 can be unnecessary, if the temperature dependence correction is not applied.

In the embodiment, each time the analog multiplexer 3 outputs any one of the first reference voltage signal Vref1, the second reference voltage signal Vref2, the third reference voltage signal Vref3, the intake air temperature voltage signal Vt to the TAD 4, the analog multiplexer 3 outputs one air flow voltage signal Vq to the TAD 4. Alternatively, each time the analog multiplexer 3 outputs any one of the first reference voltage signal Vref1, the second reference voltage signal Vref2, the third reference voltage signal Vref3, the intake air temperature voltage signal Vt to the TAD 4, the analog multiplexer 3 can output two or more air flow voltage signals Vq to the TAD 4.

In the embodiment, the control pulse generator for the sampling control pulse signal to the analog multiplexer 3 is included in the digital processor 5. Alternatively, the control pulse generator can be included in the TAD 4. Alternatively, the control pulse generator can be located outside the TAD 4 and the digital processor 5.

Such changes and modifications are to be understood as being within the scope of the present invention as defined by the appended claims.

What is claimed is:

1. An air flow measurement apparatus comprising:
a signal processing unit comprising:
(a) a flow detector including a flow sensor configured to detect air flow through a flow passage, the flow detector configured to convert an output signal of the flow sensor into a voltage;
(b) a reference voltage generator configured to output a plurality of reference voltage signals used for a correction applied to a flow voltage signal that is the output signal of the flow sensor; and
(c) an A/D converter including a multiplexer configured to sequentially select the flow voltage signal and the plurality of reference voltage signals in a predetermined order, the A/D converter configured to sequentially sample and convert the flow voltage signal and the plurality of reference voltage signals into digital data in the order selected by the multiplexer, wherein
the signal processing unit applies a calculation or the correction to the digital data of the flow voltage signal using the digital data of the plurality of reference voltage signals, the signal processing unit including a sampling timing setting section configured to set sampling timings at which the A/D converter samples the flow voltage signal and the plurality of reference voltage signals, and
the sampling timing setting section sets the sampling timings in such a manner that the sampling timing at which the air flow voltage signal is sampled is interposed between the sampling timings at which each successive two of the plurality of reference voltage signals are sampled.

2. The air flow measurement apparatus according to claim 1, wherein
the signal processing unit applies the calculation or the correction using the digital data of the plurality of reference voltage signals that are sampled immediately before the flow voltage signal is sampled.

3. The air flow measurement apparatus according to claim 1, wherein
the signal processing unit includes a control pulse signal generator configured to output a control pulse signal in each sampling cycle for sampling the plurality of reference voltage signals and the flow voltage signal, and
the multiplexer sequentially selects and outputs the flow voltage signal and the plurality of reference voltage signals to the A/D converter in response to the control pulse signal.

4. The air flow measurement apparatus according to claim 1, wherein
the signal processing unit includes a digital processor configured to output a digital output signal by applying the calculation or the correction to the digital data of the flow voltage signal by using the digital data of the plurality of reference voltage signals.

5. The air flow measurement apparatus according to claim 4, wherein
the digital processor includes an output characteristic correcting section configured to apply linear correction to the digital data of the flow voltage signal by using a liner correction formula that is set based on the digital data of the plurality of reference voltage signals.

6. The air flow measurement apparatus according to claim 4, wherein the signal processing unit includes a frequency converter configured to convert the digital output signal into a frequency signal.

7. The air flow measurement apparatus according to claim 1, wherein
the A/D converter is configured as a time A/D converter, the time A/D converter sequentially samples analog input signals in the order selected by the multiplexer, and
each time the time A/D converter samples the analog input signal, the time A/D converter converts the analog input signal into digital data and outputs the digital data.

8. An air flow measurement apparatus comprising:
a signal processing unit comprising:
(a) a flow detector including a flow sensor configured to detect air flow through a flow passage, the flow detector configured to convert an output signal of the flow sensor into a voltage;
(b) a temperature detector including a temperature sensor configured to detect a temperature of the air flowing through the flow passage, the temperature detector configured to convert an output signal of the temperature sensor into a voltage;
(c) a reference voltage generator configured to output a plurality of reference voltage signals used for a correction applied to a flow voltage signal that is the output signal of the flow sensor; and
(d) an A/D converter including a multiplexer configured to sequentially select the flow voltage signal, the plurality of reference voltage signals, and a temperature voltage signal that is the output signal of the temperature sensor in a predetermined order, the A/D converter configured to sequentially sample and convert the flow voltage signal, the plurality of reference voltage signals, and the temperature voltage signal into digital data in the order selected by the multiplexer, wherein the signal processing unit applies a calculation or the correction to the digital data of the flow voltage signal by using the digital data of the plurality of reference voltage signals and the temperature voltage signal, the signal processing unit including a sampling timing setting section configured to set sampling timings at which the A/D converter samples the flow voltage signal, the plurality of reference voltage signals, and the temperature voltage signal, and the sampling timing setting section sets the sampling timings in such a manner that the sampling timing at which the air flow voltage signal is sampled is interposed between the sampling timings at which each successive two of the plurality of reference voltage signals and the temperature voltage signal are sampled.

9. The air flow measurement apparatus according to claim 8, wherein the signal processing unit applies the calculation or the correction by using the digital data of the plurality of reference voltage signals and the temperature voltage signal that are sampled immediately before the flow voltage signal is sampled.

10. The air flow measurement apparatus according to claim 8, wherein the signal processing unit includes a control pulse signal generator configured to output a control pulse signal in each sampling cycle for sampling the plurality of reference voltage signals, the flow voltage signal, and the temperature voltage signal, and the multiplexer sequentially selects and outputs the flow voltage signal, the plurality of reference voltage signals, and the temperature voltage signal to the A/D converter in response to the control pulse signal.

11. The air flow measurement apparatus according to claim 8, wherein the signal processing unit includes a digital processor configured to output a digital output signal by applying the calculation or the correction to the digital data of the flow voltage signal by using the digital data of the plurality of reference voltage signals and the temperature voltage signal.

12. The air flow measurement apparatus according to claim 11, wherein the digital processor includes a temperature characteristic correcting section configured to apply a temperature correction to the digital data of the flow voltage signal by using the digital data of the temperature voltage signal.

13. The air flow measurement apparatus according to claim 11, wherein the signal processing unit includes a frequency converter configured to convert the digital output signal into a frequency signal.

14. The air flow measurement apparatus according to claim 8, wherein the A/D converter is configured as a time A/D converter, the time A/D converter sequentially samples analog input signals in the order selected by the multiplexer, and each time the time A/D converter samples the analog input signal, the time A/D converter converts the analog input signal into digital data and outputs the digital data.

\* \* \* \* \*